United States Patent [19]
Morse

[11] 3,723,755
[45] Mar. 27, 1973

[54] PARAMETRIC AMPLIFIER

[76] Inventor: Arthur L. Morse, 1420 Randall Court, Los Angeles, Calif. 90065

[22] Filed: Oct. 12, 1970

[21] Appl. No.: 80,112

[52] U.S. Cl. ....................307/88.3, 307/88, 307/306, 324/43 R, 330/4.5, 331/107 S
[51] Int. Cl. ..............................................H03k 3/38
[58] Field of Search ........330/4.5; 307/88, 88.3, 306; 331/107 S

[56] References Cited

UNITED STATES PATENTS

| | | | |
|---|---|---|---|
| 3,599,009 | 8/1971 | Parmentier et al. | 307/306 |
| 3,111,628 | 11/1963 | Landauer | 330/4.5 |
| 3,363,200 | 1/1968 | Jaklevic | 307/306 |
| 3,363,211 | 1/1968 | Lambe et al | 307/306 |
| 3,573,661 | 4/1971 | McCumber | 307/306 |
| 3,573,662 | 4/1971 | Fulton | 307/306 |

*Primary Examiner*—Roy Lake
*Assistant Examiner*—Darwin R. Hostetter
*Attorney*—christie, Parker and Hale

[57] ABSTRACT

A high frequency parametric amplifier using the quantum mechanical oscillation associated with transitions of electron pairs between two macroscopic quantum states, (Josephson tunneling) as the source of the idler or pumping frequency. An incoming signal causes the relative phase of two such cross coupled quantum amplifiers to change. This produces a change in the low frequency resistance of the device leading to relatively large output voltages.

7 Claims, 8 Drawing Figures

INVENTOR.
ARTHUR L. MORSE
BY
Christie, Parker & Hale
ATTORNEYS

PARAMETRIC AMPLIFIER

BACKGROUND OF THE INVENTION

This invention relates to superconducting transitions between macroscopic quantum states and more particularly to coupled, multiple junction, superconducting interference devices utilized as circuit components for amplifying and/or measuring electric currents, potentials, and magnetic fields.

The use of interference techniques based solely on the quantum wave function associated with the flow of electrons in a current carrying superconductor to obtain a control or modulation function has previously been recognized, see, for example, U.S. Pat. No. 3,363,211. More specifically, as described therein, control or modulation of the total current flowing between two superconductors via a pair of superconducting junctions is obtained by causing a relative phase displacement of the quantum wave function between the junctions thus controlling the current flowing through the individual junctions. Depending upon this phase displacement, the combination of the two currents will normally produce a current of a lesser amplitude than that which would flow if the wave functions were not coupled. To obtain this coupling (or interference) of wave functions, the two junctions must be integral parts of two continuous superconductors having a wave function coherence length greater than the junction separation.

In terms of specific applications, superconducting interfer-ence devices have been used in precision, high sensitivity, current, voltage and magnetic flux measuring applications. In one instance, two superconductive elements are brought together in such a manner that a pair of superconducting junctions (weak links, Josephson junctions) are formed, the elements and junctions defining a loop enclosing a specific magnetic flux. A source of electrical energy is connected to the elements to force current through the junctions. In such an arrangement the superconducting current (also referred to as the dissipationless current) is a function of the magnetic flux within the enclosed area. Increasing and decreasing this field produces a corresponding change in the current through the device. This interrelation of flux and current is utilized in amplifier, magnetometer and computing element applications.

As is reflected in use of terms such as "dissipationless current" to characterize the operation of such devices, it has heretofore been believed that the supercurrents (dissipationless currents) exist and are controllable only when the amount of current flowing through the device is suitably limited. Below a certain critical value or current, the direct supercurrent flows without producing a voltage drop across the junctions. Above the critical current, such currents are thought to cease and a finite voltage drop across the junction is encountered. The regions of operation above and below the critical current value are normally referred to as the DC Josephson region and AC Josephson region, respectively. Thus, for the devices of the prior art, operation involved frequent determination of the limits of the DC Josephson range.

SUMMARY OF THE PRESENT INVENTION

The present invention is based purely on electromagnetic interference effects occuring between quantum oscillators, that is, superconducting junctions which are continuously held in the "AC Josephson region" thereby producing a continuous train of electromagnetic oscillation.

According to the theory advanced by Josephson, such oscillation is produced when spin correlated electrons make a transition across a specific type of junction between two superconductors. The two superconductors and the junction between provide a pair of quantum states in which transitions can take place in either direction. No net current flow is produced, however, until a portion of the energy associated with the transitions is absorbed or escapes. As part of the present invention, means for absorbing a portion of this energy is provided causing a measurable macroscopic current to flow. Further, controlling the rate of absorption of this energy can be shown to produce a change in the magnitude of the net macroscopic current flow across the junction. By introducing radiation from a source external to the superconductors, an increase or a decrease of the current is produced in the presence of nonlinear energy absorption depending on whether the external radiation is in phase or out of phase with the internal radiation. In addition, a "pulling effect" has been found to be exerted on the frequency of the internal radiation where the frequency of the externally applied radiation is near or is a harmonic frequency of the natural frequency of radiation of the junction. The result of this "pulling effect" is that the internal frequency is pulled toward and locked onto the external frequency. Control of the frequency of radiation across a superconducting junction by means of the pulling effect is utilized in the present invention to establish the necessary conditions whereby externally applied signals produce relative phase changes in the oscillating radiation across coupled superconducting junctions which in turn permits measurement or amplification of the external signal.

The principle of operation according to the present invention is the provision of a means of absorbing a part of the energy of a quantum oscillator. In the case of a single superconducting junction this is accomplished by providing a finite ohmic resistance as an integral part of the junction. Under such a condition a net current flows across the junction, the value or magnitude of which is determined by the relative ease or difficulty of absorption of radiation. In the present invention, the absorption of energy is accomplished through ohmic loses associated with operation in the AC Josephson region. By so doing, it is possible to couple the observable effects of one quantum oscillator (superconducting junction) to another or to other sources of stimulating external radiation.

By coupling a second superconducting junction to a first superconducting junction in a parallel circuit relationship and driving both in the AC Josephson range, the energy or radiation absorption mechanism is provided by the cooperative action of one junction relative to the other. The second junction coupled to the first also exerts a pulling action causing the frequency of oscillation of the first junction to lock on that of the second junction. Having established the proper operating conditions, connection of the parallel superconducting junctions to an external signal source and providing an output from the device yields a superconducting circuit component capable of high gain amplification.

Amplification is accomplished in the following manner: If the high frequency oscillation from each junction is in phase, the net RF voltage in the loop is a maximum, net current flow is maximum, and net impedance of the junctions is relatively low. If the oscillation is out of phase, the opposite occurs, voltage, power loss and current is minimum and net impedance is relatively high. The change in net impedance when radiation changes from in phase to out of phase can be made as great as several ohms depending on the degree of cross-coupling of radiation yielding signal levels as large as $50 \times 10^{-6}$ volts.

Viewed from another aspect, a signal is applied from an external source to produce a change of relative phase in the radiation from a pair of cross-coupled junctions and a corresponding impedance change. The voltage or external signal level necessary to cause a pair of quantum oscillators to change relative phase by 180° has been found to be a differential voltage of $10^{-15}$ volts applied for one second. At 1 Hertz (Hz) this yields an amplification factor on the order of $10^{10}$ and even at 1 Megahertz ($10^6$ MHz), gains on the order of $10^4$ are obtained.

The present invention provides a macroscopic quantum circuit component comprising a first and second superconductor defining a superconducting junction. Means for imposing a potential difference between the superconductors is provided to produce an oscillating electric field across the junction as is means for controlling the amplitude of the oscillation. Finally, means for selectively absorbing a portion of said oscillations in a manner proportional to the square of the amplitude of oscillation is provided.

In another aspect, the invention provides a superconducting current component comprising a first superconducting junction having a first and second side and a second superconducting junction also having a first and second side. Means is provided for coupling one side of each of said junctions and impedance means is provided for coupling the remaining side of each of said junctions.

In addition to providing a high gain parametric amplifier, the device of the present invention when used directly as a preamplifier provides the means whereby electrical voltages or currents can be measured at high speeds with great sensitivity, precision and accuracy. An amplifier according to the present invention has additional properties which arise from the fact that it incorporates a fundamental quantum level phenomena in its operation, and uses certain superconducting components for impedance elements. Since superconducting quantum oscillators have a frequency given exactly by $f= 2eV/h$ and $d\phi/dt = 2\pi f$, the rate of phase change ($\phi$) can be used to determine the voltage with extreme accuracy. Because the output of such oscillators repeats precisely with each cycle, a small change in a large input signal is as easily detected as a small signal itself.

By suitable modification of the basic circuit component according to the present invention, such as by using a finite resistor in series with a resistanceless (superconducting) inductor as an impedance element, the voltage sensitivity can be effectively integrated so that the phase itself rather than the rate of change of phase is proportional to the applied voltage. Similarly, by producing an output voltage by sending current through a resistanceless inductor, the phase is made strictly proportional to the current flow. In general a combination of internal and external impedance elements (resistors, capacitors, inductors), non linear elements (diodes, function generators) and distributed elements (delay lines, wave guides) can be used to cause an extremely wide variety of input signals to produce an observable effect on either the phase or the rate of change of the phase within the device and be manifested by the output voltage from the device. In all cases the advantage of high sensitivity, even in the presence of large input signals and high accuracy (due both to the ease of relating the measurement to the fundamental constants of nature, and the inherent stability and drift free operation of the device) are available.

DESCRIPTION OF THE DRAWINGS

The present invention will be better understood by reference to the following figures wherein.

DESCRIPTION OF A SPECIFIC EMBODIMENT

In ordinary quantum mechanical systems, if an electron makes a transition between two states whose potential difference is ΔV, a single photon will be produced of a frequency given by the Einstein equation, $f=e\Delta V/h$ where $h$ is Planck's constant and e is the electronic charge. In the case of superconductors, electrons are most strongly coupled in pairs and as predicted by Josephson the frequency produced when such a pair of electrons make a transition between two superconductors whose potential difference is $\Delta V$ is $$f=2e\Delta V/h$$

In the case of a time dependent $\Delta V$, this must be restated as $\Delta\phi = 2e\Delta V/\hbar$ (Equation 1) where $\Delta\phi$ is the change in the phase of the wave function is going from the first to second superconductor $\hbar$ is $h/2\pi$ and $\Delta\dot{\phi}$ is the time rate of change of phase of the wave function.

For a single pair of electrons making the transition this frequency is unique and $2e\Delta V$ is precisely the difference in the energy contained by the electron pair and electron lattice immediately before and after recorrelation with the electrons of the second superconductor. The resulting electromagnetic field stimulates the coherent emission, transition, absorption and radiation of additional electron pairs such that a macroscopic current flows between the two superconductors given to first order by $$I_s = I_{sm} \sin\Delta\phi \text{ where}$$

$I_s$ is the instantaneous value of the supercurrent and $I_{sm}$ is a current parameter depending on the physical coupling of the superconductors at the Josephson junction. These two equations when combined with the appropriate equations from conventional electromagnetic theory are sufficient to describe the operation of the various systems and configurations of the present invention.

If a constant current $I$ is suddenly caused to pass through a single weak link junction, and if $I$ is less than $I_{sm}$, the phase shift $\Delta\phi$ will change as given in Equation 1 so as to accommodate the new current. If, however, a constant current ($I_t = I_n + I_s$) greater than $I_{sm}$ is forced to flow through a tunneling junction, the behavior involves the normal resistance or normal tunneling current of the junction (which is ohmic), and Equation 1 then becomes $$\Delta\dot{\phi} = (2eR/h)(I_t - I_{sm}\sin\Delta\phi) \text{ where}$$

R is the "normal" resistance of the junction.

Figure 1A:
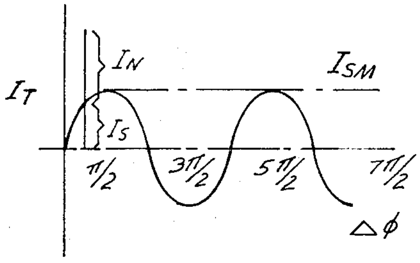
FIGS. 1A and 1B are graphs illustrating the relationship of various parameters in the operation of devices according to the present invention.
Figure 1B:
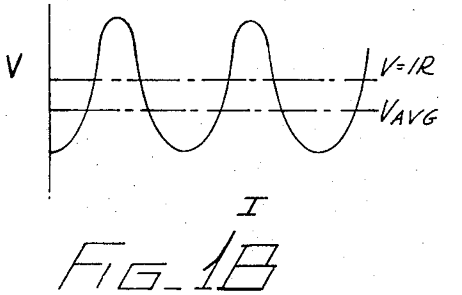

The significance of this equation is illustrated by reference to FIG. 1A. If $\Delta\phi$ is $\pi/2$, $5\pi/2$, etc. $\Delta\dot{\phi}$ is a minimum and the supercurrent is an appreciable part of the total current for a relatively long time. If however $\Delta\phi$ is $3\pi/2$, $7\pi/2$, etc., $\Delta\dot{\phi}$ is maximum and the interval in which the supercurrent opposes the total current is passed through relatively quickly. The net result is the average voltage ($V_{ave}$) (FIG. 1B) across the junction is considerably less than would exist if $\Delta\dot{\phi}$ were constant. In that case the positive and negative contribution of $I_s$ would cancel precisely and the time averaged voltage would be simply $V=IR$.

Control of the amplitude of oscillations across the junction can be described as follows: By adding an external RF voltage in phase with the above oscillating voltage, the effects leading to a decreased average voltage drop across the junction is augmented and the time average voltage reduced still further. Adding an external RF signal out of phase with the oscillating voltage causes the amplitude of oscillation of $\Delta\dot{\phi}$ to be reduced so that the time average supercurrent contributes relatively less and the average voltage drop is increased. The same analysis is also applicable when the frequency of the external RF is an exact subharmonic of the fundamental frequency of the junction. If a second junction is RF linked to the first, the average voltage associated with a given current bias will depend on the relative phase of oscillation of the two junctions and a mechanism for selective absorption of a portion of the radiation (energy) across the first junction in a manner proportional to the square of the amplitude of oscillation is provided. This voltage variation with phase of oscillation can be made very large, if desired, by properly controlling the normal resistance of the junctions, $I_{sm}$, and the current bias. The present invention makes use of such a phase dependant voltage or more generally the variation of junction impedance with the amplitude of the radio frequency energy across the junction to ultimately couple the behavior of various systems of macroscopic quantum states to conventional laboratory instrumentation. As indicated previously, quantum oscillators run at a frequency given by $f=2eV/h$. *Thus*

$$\phi = \frac{2e}{h}\int V\,dt,\ \left(f = \frac{d\phi}{dt}\right)$$

and again, as previously indicated, a differential voltage impulse of $10^{-15}$ volts-seconds has been found to cause the relative phase to change by 180°. Moreover, phase changes of as small as a fraction of a degree have been observed, corresponding to a sensitivity of $10^{-18}$ volt seconds.

Figure 2:
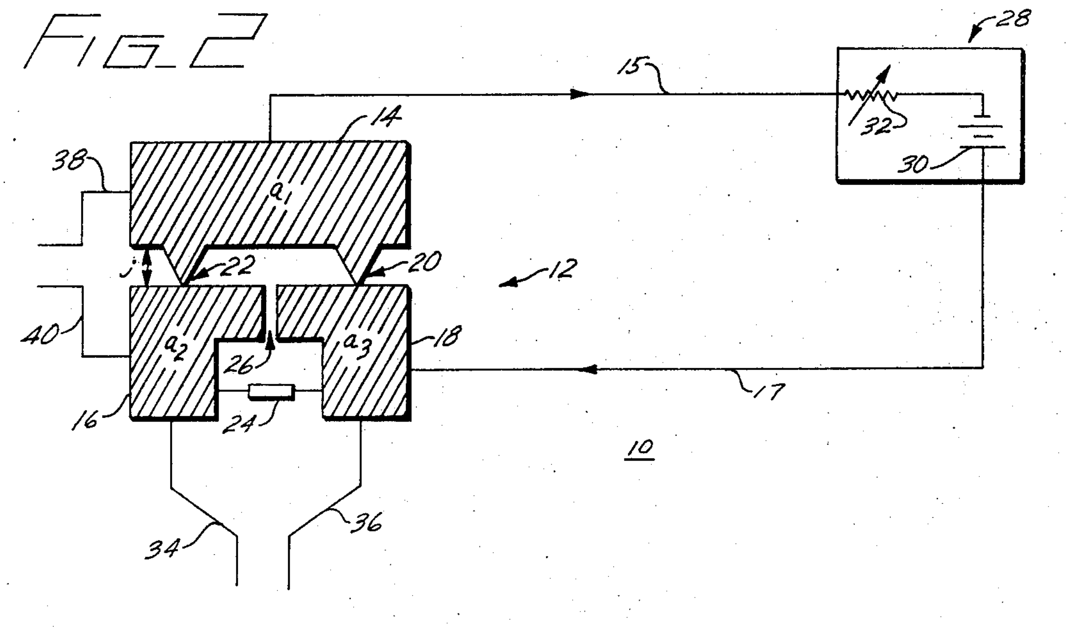
FIG. 2 is a schematic sectional diagram illustrating the superconducting circuit component of the present invention connected in a galvanometer configuration.

A galvanometer circuit 10 utilizing a macroscopic circuit component 12 according to the present invention is shown in schematic form in FIG. 2. Component 12 comprises 3 superconducting pieces or elements 14, 16, 18 defining a first superconducting junction 20, between element 14 and element 18, and a second superconducting junction 22 between element 14 and element 16. Junctions 20 and 22 are linked on one side by the continuity of superconducting element 14 and on the opposite by an impedance 24. The configuration of elements 16 and 18 is arranged such that a narrow gap 26 is defined providing for cross coupling of radiation (energy) between junctions 20 and 22. In regions removed from junctions 20, 22, a relatively large gap *j* is provided between element 14 and elements 16 and 18 to decrease capacitance and prevent undesired attenuation of the amplitude of RF energy. A constant current source 28 comprising a source of voltage 30 and a variable impedance 32 is connected to elements 14 and 18 through leads 15, 17 respectively. An input signal is coupled to device 10 by means of input leads 34, 36 connected to elements 16, 18 respectively. The output signal from the device is derived by means of output leads 38, 40 connected to elements 14, 16 respectively. The superconducting link and impedance link coupling junctions 20 and 22 are representative of the various ways in which the two junctions can be linked. Depending on the specific application, it is contemplated that the junction links can be entirely superconductors, entirely impedances, or combinations of the two.

The operation of the system as illustrated in FIG. 2 is as follows: Superconductive elements, 16, 18 are weakly coupled to element 14 with Josephson tunneling links at junctions 20, 22. Constant current source 28 causes a current I to flow in parallel through the junctions. The current I is increased to the point where it exceeds the combined critical current of the two junctions. Since the current is constant (assuming impedance 24 is dissipationless), the average voltage across the two junctions is exactly equal and oscillating radiations with a particular time independent frequency and phase relation are produced across the junctions. If, however, $10^{-15}$ volts is applied via input leads 34, 36 for one second, the relative phase of oscillations at each junction is reversed and the voltage measured at the output 38,40 changes correspondingly. If voltage across the junctions is initially minimum due to the junctions oscillating in phase, the $10^{-15}$ volts-second makes it maximum by reversing the phase. This voltage impulse also causes a current to flow in impedance 24. Where impedance 24 is an inductor, the current flowing is given by $$I=\frac{1}{L}\int Vdt=\frac{10^{-15}}{L}\text{ volts-second}/L$$

where $L$ is measured in henries

The instantaneous phase difference is thus proportional to the current flow in impedance 24. Thus circuit 10 can be considered to be a zero DC-resistance ammeter.

Where element 24 includes a resistive component a drifting rather than a locked relationship of the relative phase at the two junctions occurs. An input signal to a device having such a resistive element produces an increase or a decrease in the rate of the drifting phase relationship. Applications of a device of this type include the performance of a counting function. In addition, the specific change in the rate of drift is indicative of the level of the input signal producing the change.

Figure 3:
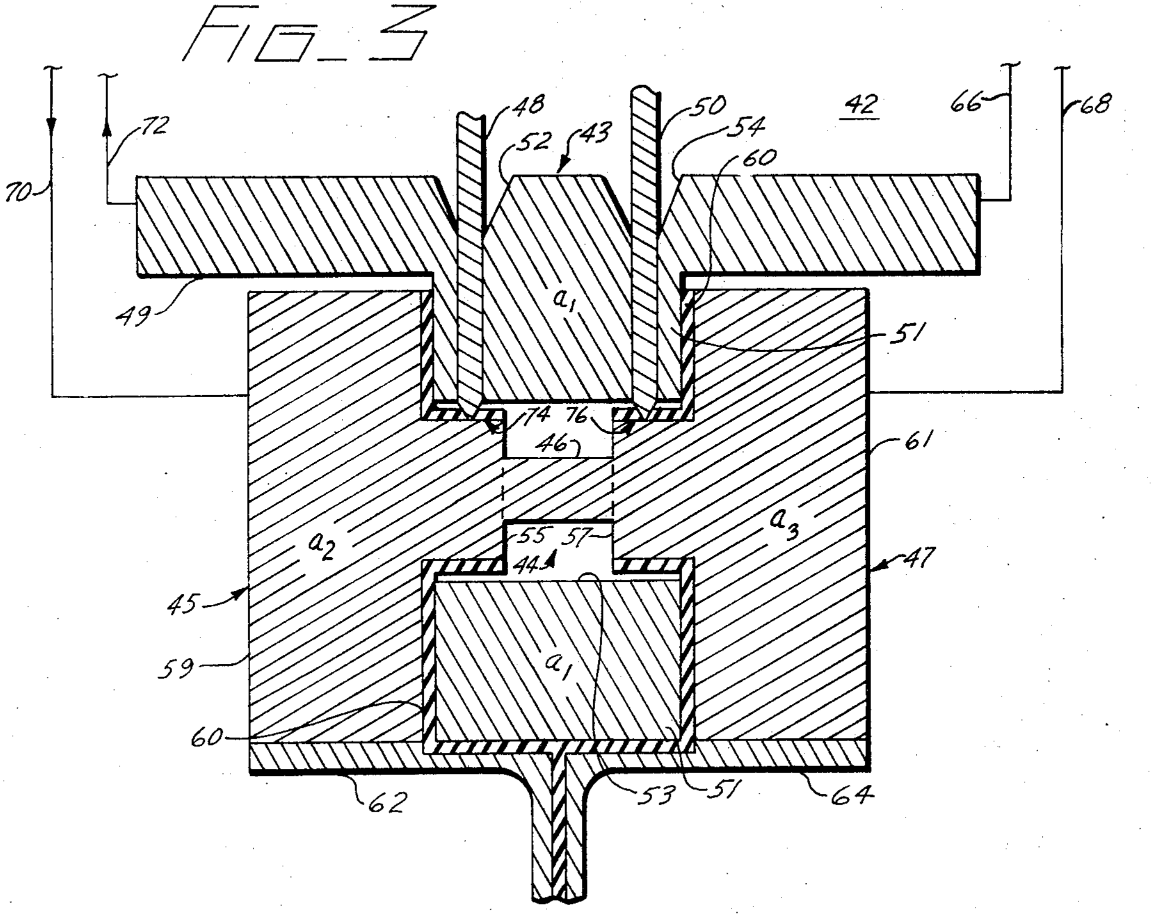
FIG. 3 illustrates a specific embodiment of the component of FIG. 2.

A specific embodiment 42 of circuit component 12 is shown in FIG. 3. Embodiment 42 comprises elements 43, 45 and 47 which are the three superconducting elements or pieces ($a_1$, $a_2$, $a_3$) of the component and corresponds to elements 14, 16 and 18 respectively of FIG. 2. Element 43 is a superconductor comprising a disc 49 having a block-shaped element 51 formed integrally with and raised from the disc and lying generally along the diameter thereof. Block 51 is provided with an aperture 53. Passing through aperture 53 is a bobbin-shaped element 44 comprising a central rod 46 and flanges 55 and 57. Formed integrally with flanges 55 and 57 and located exteriorly of aperture 53 are a pair of larger flange-shaped elements 59, 61. Flanges 55 and 59 comprise superconducting element 45. Flanges 57, 61 comprise superconducting element 47. Central rod 46 corresponds to impedance 24 of FIG. 2. In the embodiment shown in FIG. 3, the structural parts comprising elements 43, 45, 47 are fabricated from niobium. Other materials exhibiting superconducting properties such as magnesium, zinc, aluminum and lead among others have also been found to be suitable in such applications.

Superconducting rods 48 and 50 are slip fitted in disc 49 and block 51 in receiving apertures 52, 54 and are caused to contact flanges 55 and 57 through insulation 60.

The points on rods 48, 50 contact flanges 55, 57 by driving them through an electrical insulator 60 (Mylar tape) provided between block 51 and flanges 55, 59, 57, 61 to insulate superconducting elements 45, 47 from element 43. Superconducting junctions 74, 76 are created at the point of contact between rod 48 and flange 55 and between rod 50 and flange 57 respectively. The input to the device is provided by means of connections or leads 62, 64 which are insulated from each other and from block 51. In this embodiment leads 62, 64 are fabricated of lead. The output from the device is obtained by means of leads 66, 68 which are connected to superconducting elements 43 and 47 respectively. The constant current source is connected to the device by means of leads 70, 72 which are connected to elements 43 and 45 respectively. In the embodiment shown in FIG. 3 rod 46 combines the functions of impedance 24 and gap 26 of FIG. 2 providing both a discrete electrical interconnection between elements 45 and 47 and the means whereby radiation is coupled between the Josephson junctions 74, 76. The resistanceless inductance L of the device of FIG. 2 is essentially presented by central rod 46, the specific value of the inductance presented being controlled by the diameter and the length of rod 46.

Figure 4:
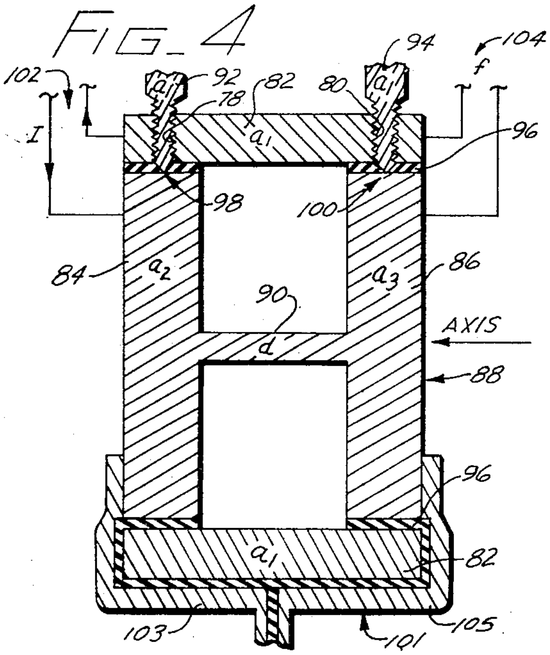
FIG. 4 is an alternate embodiment of the component of FIG. 3.

Referring now to FIG. 4, there is shown therein an alternate embodiment of the device shown in FIG. 2. In this embodiment threaded apertures 78, 80 are provided in a cylinder 82 formed of a superconducting material. Cylinder 82 provides a first superconducting element $a_1$. A bobbin 88 of a superconducting material is located within element 82 with the flanged portions 84, 86 of the bobbin providing the second and third superconducting elements ($a_2$, $a_3$) of the component. Flanges 84, 86 are interconnected by and integrally formed with a central rod 90. Threaded rods 92, 94 are engaged in apertures 78, 80 respectively and are also formed from a superconducting material ($a_1$). Rods 92 and 94 are advanced through apertures 78, 80 until electrical insulation 96, for example, Mylar tape, is pierced establishing a pair of superconducting junctions 98, 100 between cylinder 82 and flange 84 and between cylinder 82 and flange 86 respectively. The input to the device is via a forked connector 101 comprising leads 103, 105 which is seated over and insulated from a portion of cylinder 82 and electrically contacts the outside surfaces of flanges 84, 86 respectively.

A constant current source is connected to elements 82, 84 at 102 and the output is taken from the device at 104 by means of leads connected to elements 82 and 86. The devices of both FIGS. 2 and 3 have rotational symmetry and provide a closed structure which prevents changing external magnetic fields from being coupled directly into the central region and producing undesired current flow. The component such as that shown in FIG. 3 is encapsulated in a suitable holder which is in turn placed in a conventional Dewar flask arrangement for the purpose of lowering the temperature of the device to the near absolute zero levels required to obtain superconductivity. Control means extending externally of the holder may optionally be provided for advancing and retracting rods 78, 80 and obtaining the specific and precise characteristics of pressure and contact desired between the superconducting elements at the superconducting junctions.

Figure 5:
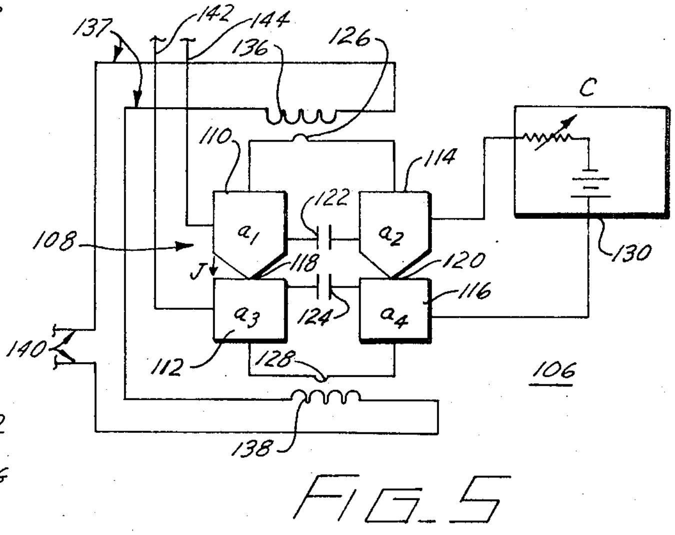
FIG. 5 is a schematic diagram of a galvanometer of the present invention wherein coupling of the superconducting elements is by means of discrete impedances.

A high impedance superconducting galvanometer circuit 106 is shown in FIG. 5. As shown therein, the device comprises a superconducting circuit component 108 made up of four discrete superconducting elements 110, 112, 114, 116 ($a_1$, $a_3$, $a_2$, $a_4$) respectively, defining superconducting junctions 118 and 120. Capacitors 122, 124 interconnect elements 110, 114 and 112, 116 respectively, to cross-couple radiation (energy) between junctions 118 and 120. Impedances 126, 128 shown as a single turn coil also interconnect elements 110, 114 and elements 112, 116 respectively for closing the loop comprising the superconducting elements and providing the circuit path for the driving current from constant current source 130. Source 130 is connected across elements 114, 116 and provides sufficient current (bias current) such that the current flowing through the superconducting junctions exceeds the combined critical current values thereof. Other impedances may also be employed interconnecting elements 110, 114 and 112, 116 respectively in parallel circuit relationship with capacitors 122, 124 depending upon specific applications. Such capacitors and inductors are also representative of the distributed capacitance and inductance which is present and can be utilized and optimized by proper configuration of the superconducting elements.

As will be shown in conjunction with the discussion of FIG. 5, single turn coils 126, 128 are representative of distributed impedances associated with the flow of currents induced in the surfaces of the device due to currents flowing in a toroid wound about the device. The coils of the toroid are represented at 136, 138 respectively. A source of input signals 140 is connected to the toroid and the output from the device is derived at leads 142, 144 connected across elements 110, 122.

Figure 6:
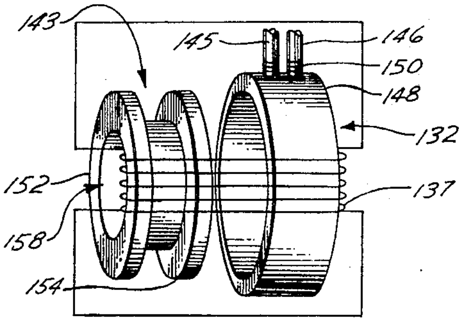
FIG. 6 is a perspective view of a specific embodiment of the superconducting circuit component of FIG. 5.

Referring now to FIG. 6, a specific embodiment of the component 108 of FIG. 5 is shown in perspective view. As with the embodiments of FIGS. 3 and 4, the component comprises a hollow cylinder 132 and a bobbin 143 adopted to be inserted within the cylinder.

Superconducting rods 145 and 146 threadedly engaged in receiving apertures 148, 150 through the wall of cylinder 132 correspond to superconducting elements 110 and 114 of FIG. 4. Flanges 152, 154 of bobbin 143 are each fabricated of a superconducting material and correspond to superconducting elements 112 and 116 respectively of FIG. 5. Contact between rod 145 and flange 152 and rod 146 and flange 154 provides the superconducting junctions 118 and 120 of FIG. 5. The toroid 137 is wound internally and externally of the device through hollow core 158 in bobbin 143.

In operation a voltage impulse at input 140 causes current to flow through coils 136, 138 of toroid 137 and induces a counterflowing current at the surfaces of the superconductors through a transformer action between the toroid and the superconductors. This produces an equal differential voltage impulse between the two superconducting junctions, changing the phase of oscillation of the two junctions and the time averaged voltage across the two superconducting junctions. Such a device has a relatively high impedance and is particularly useful in measuring currents from high impedance sources.

Figure 7:
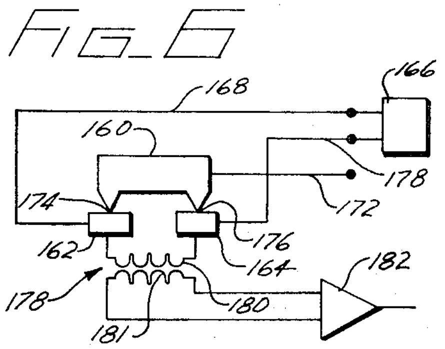
FIG. 7 is a schematic diagram of a superconducting harmonic ammeter according to the present invention.

A superconducting harmonic ammeter is schematically illustrated in FIG. 7. As connected therein superconducting elements 160, 162 and 164 are driven in series from a current source 166 connected to element 162 via lead 168 and to element 164 via lead 170. Lead 172 is connected to element 160 and the input signal to the device is applied across leads 170, 172. The path of driven current through the device traces along lead 168 through element 162, superconducting junction 174, element 160, supercon-ducting junction 176, element 164 and returns via lead 170. A transformer 178 having its primary winding 180 connected across elements 162, 164 couples the output signal via a secondary winding 181 to an amplifier 182 for connection to a suitable readout device. If the junctions 174, 176 are initially adjusted, voltage plateaus for certain currents are encountered which produce harmonically related frequencies at junctions 174, 176. A relatively small amount of additional current flow through only one of said junctions will shift the voltage plateau an amount which is proportional to the current.

What has been described by the foregoing is an ultrasensitive amplifying device capable of attaining virtually noise free amplification using reciprocally stimulated macroscopic quantum oscillators. The device is a high frequency ($10^{12}$ $H_z$) parametric amplifier and as described in detail uses Josephson tunneling as the source of pumping frequency. An input signal to the device produces a change of relative phase of two cross-coupled quantum amplifiers and a change in the low frequency resistance of the device enabling the device to produce relatively large output signals. When used in conjunction with conventional low noise amplifier, a single stage device (amplifier) according to the present invention increases the sensitivity with which low frequency measurements can be made by eight to ten orders of magnitude relative to conventional high sensitivity electrical measurements. The very high pumping frequency enables useful amplification for frequencies as high as $10^4$ $MH_z$.

The device is characterized by a voltage sensitivity of $10^{-18}$ volts enabling use of the device with a single turn pickup loop to make sensitive magnetic field measurements. Applications for a device with this capability include direct measurement of the magnetic field associated with cardiac activity. Other applications include among others use in solid state particle detectors in space and nuclear physics investigations.

I claim:

1. A macroscopic quantum circuit device comprising:
   - a first and second superconductor defining a superconducting junction;
   - means for imposing a potential difference between the superconductors to produce oscillating electric field across said junction;
   - means for controlling the amplitude of the oscillations of the field across said junction; and
   - means for selectively absorbing a portion of said oscillations in a manner proportional to the square of the amplitude of oscillation.

2. A superconducting circuit device comprising:
   - a first superconducting junction having a first and second side;
   - a second superconducting junction having a first and second side;
   - impedance means coupling a side of each of said junctions, and
   - means for coupling a pump frequency oscillating electric field between each of said junctions, said coupling means being connected in parallel circuit relationship with the impedance means.

3. A superconducting circuit device comprising:
   - a first superconducting junction;
   - a second superconducting junction;
   - means for producing electromagnetic oscillation across each superconducting junction, the oscillation across each junction having a characteristic phase; and means for cross coupling the oscillations of each junction.

4. The device of claim 3 including means operatively linked to the component for producing a change of phase of the oscillation across one of said junctions relative to the oscillation across the second junction.

5. The device of claim 3 including output means operatively linked to the component for observing a change in the operating characteristics of the junctions.

6. A parametric amplifier comprising:

first, second, third and fourth superconducting elements;

a first superconducting junction defined by said first and second elements;

a second superconducting junction defined by said third and fourth elements;

circuit means interconnecting said first and third elements;

impedance means interconnecting said second and fourth elements;

input means connected to one side of said first and second junctions;

output means connected across a first one of said junctions; and biasing means connected across the second one of said junctions.

7. A macroscopic quantum circuit device comprising:

a first quantum oscillator having a first and second side;

a second quantum oscillator having a first and second side;

means interconnecting one side of each oscillator;

impedance means interconnecting the remaining side of each oscillator; and means operatively linked to said component to produce a relative change of frequency in radiation from each oscillator.

* * * * *